United States Patent
Klostermann

(10) Patent No.: US 7,838,861 B2
(45) Date of Patent: Nov. 23, 2010

(54) INTEGRATED CIRCUITS; METHODS FOR MANUFACTURING AN INTEGRATED CIRCUIT AND MEMORY MODULE

(75) Inventor: Ulrich Klostermann, Munich (DE)

(73) Assignees: Qimonda AG (DE); Altis Semiconductor, SNC (FR)

( * ) Notice: Subject to any disclaimer, the term of this patent is extended or adjusted under 35 U.S.C. 154(b) by 145 days.

(21) Appl. No.: 11/856,668

(22) Filed: Sep. 17, 2007

(65) Prior Publication Data

US 2009/0072217 A1    Mar. 19, 2009

(51) Int. Cl.
*H01L 29/02* (2006.01)
(52) U.S. Cl. .................. 257/2; 257/3; 257/4; 257/5; 257/E29.002; 438/102; 438/103; 365/163
(58) Field of Classification Search .................. 257/1–5, 257/E29.002; 438/102–103; 365/163
See application file for complete search history.

(56) References Cited

U.S. PATENT DOCUMENTS

| 7,319,235 | B2 | 1/2008 | Happ |
| 2003/0077844 | A1 | 4/2003 | Lee |
| 2003/0174638 | A1* | 9/2003 | Maekawa et al. ........ 369/275.1 |
| 2004/0256610 | A1 | 12/2004 | Lung |
| 2006/0003515 | A1* | 1/2006 | Chang ........................ 438/210 |
| 2006/0071244 | A1* | 4/2006 | Gutsche et al. ............. 257/250 |
| 2006/0113521 | A1* | 6/2006 | Lung .............................. 257/4 |
| 2007/0254428 | A1 | 11/2007 | Willer et al. |

FOREIGN PATENT DOCUMENTS

| DE | 10 2004 031 135 A1 | 1/2006 |
| DE | 10 2006 020 179 A1 | 11/2007 |

* cited by examiner

*Primary Examiner*—Bradley K Smith
*Assistant Examiner*—Jami M Valentine

(57) ABSTRACT

Embodiments of the present invention relate generally to integrated circuits, to methods for manufacturing an integrated circuit and to a memory module. In an embodiment of the invention, an integrated circuit is provided having a programmable arrangement. The programmable arrangement includes a substrate having a main processing surface, at least two first electrodes, wherein each of the two first electrodes has a side surface being arranged at a respective angle with regard to the main processing surface, the side surfaces facing one another. The programmable arrangement may further include at least one second electrode and ion conducting material between each of the at least two first electrodes and the at least one second electrode, wherein the at least one second electrode is arranged partially between the side surfaces of the two first electrodes facing one another.

24 Claims, 7 Drawing Sheets

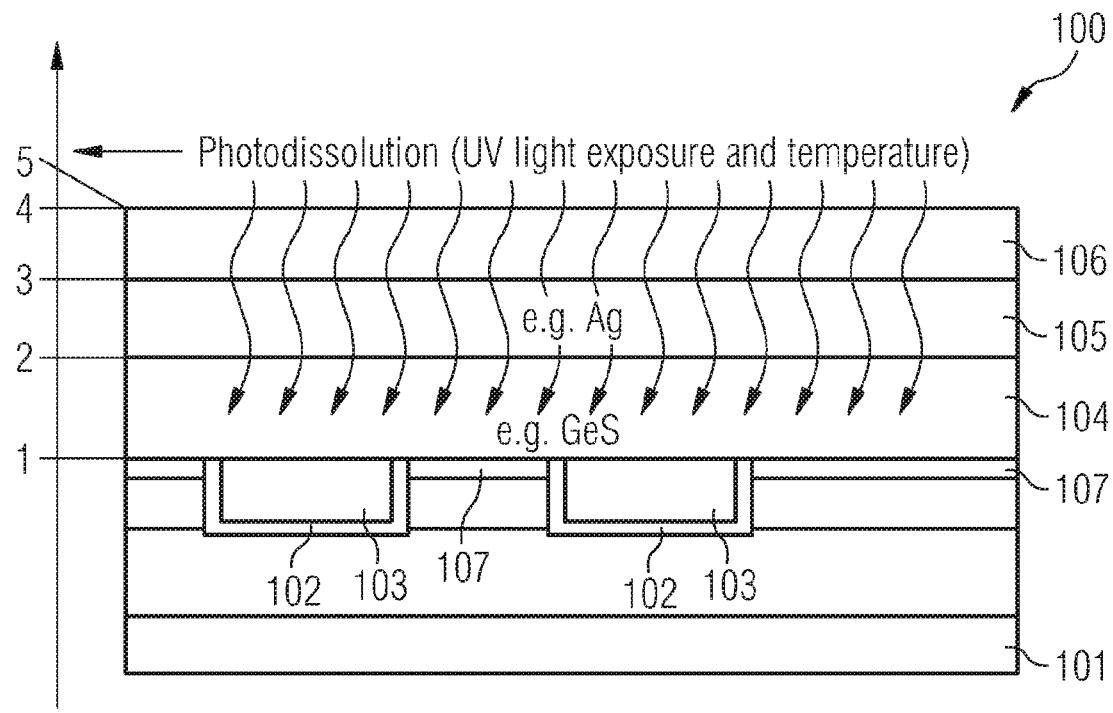
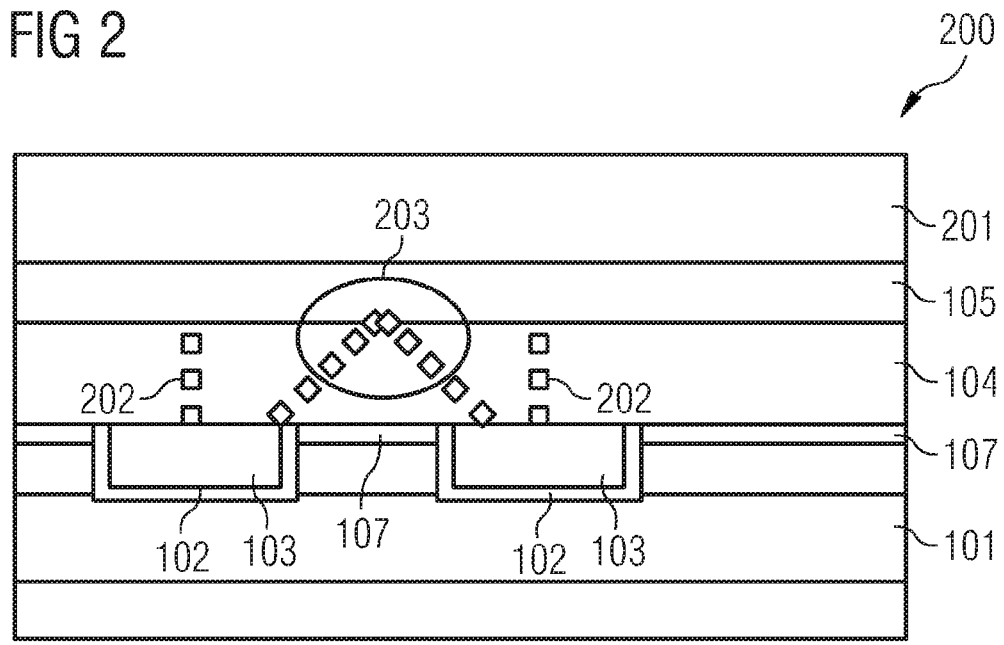

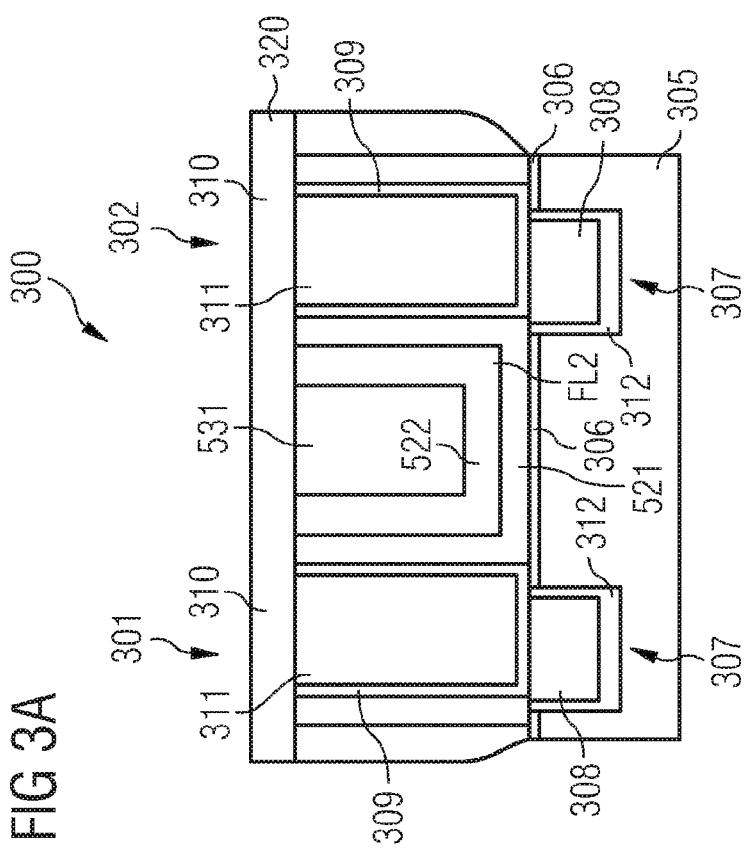

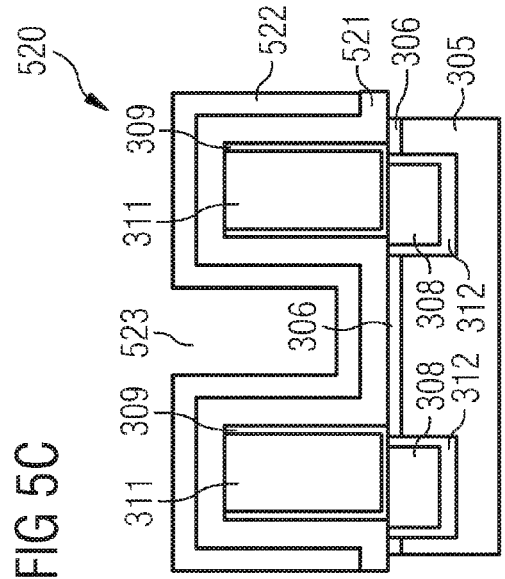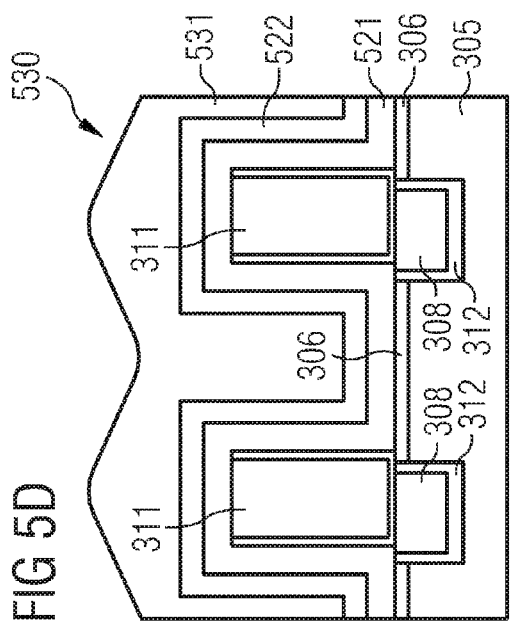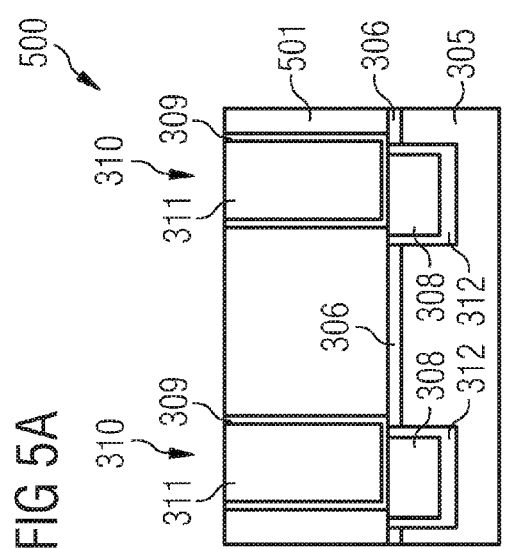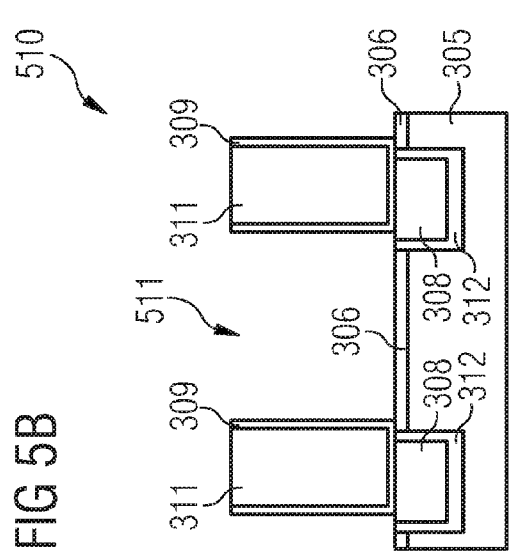

INTEGRATED CIRCUITS; METHODS FOR MANUFACTURING AN INTEGRATED CIRCUIT AND MEMORY MODULE

TECHNICAL FIELD

Embodiments of the present invention relate generally to integrated circuits, to methods for manufacturing an integrated circuit and to a memory module.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a cross sectional view of a programmable arrangement;

FIG. 2 shows a cross sectional view of a programmable arrangement, in which an undesired formation of a dendrite between the first electrode and the second electrode is shown;

FIG. 3A shows a cross sectional view of a programmable arrangement in accordance with an embodiment of the invention;

FIG. 3B shows a top view of a portion of a programmable arrangement in accordance with an exemplary embodiment of the invention;

FIG. 5A shows a cross sectional view of a programmable arrangement at a first time instant of its manufacture;

FIG. 5B shows a cross sectional view of a programmable arrangement at a second time instant of its manufacture;

FIG. 5C shows a cross sectional view of a programmable arrangement at a third time instant of its manufacture;

FIG. 5D shows a cross sectional view of a programmable arrangement at a fourth time instant of its manufacture;

DETAILED DESCRIPTION OF ILLUSTRATIVE EMBODIMENTS

Figure 4:
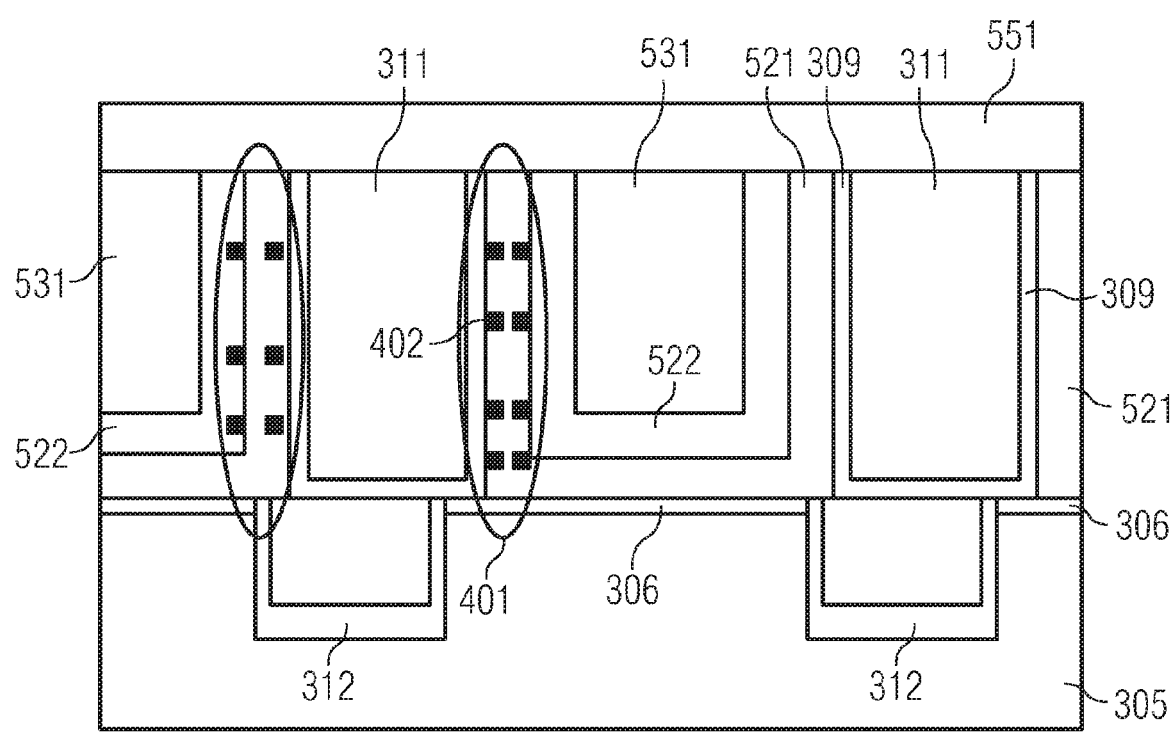
FIG. 4 shows a cross sectional view of a programmable arrangement in accordance with an exemplary embodiment of the invention, wherein a formation of a horizontally aligned dendrite is shown.

FIG. 1 shows a common programmable arrangement 100, in which a surface region of a dielectric 101 is patterned into a substrate 101 made of a dielectric according to a damascene method, so that trenches are formed. A diffusion barrier layer 102 is applied onto the upper surface of the substrate 101 and the side walls of the trench and the bottom of the trench. The diffusion barrier layer 102 (which may be electrically conductive material) is positioned on the sidewalls and the bottom of the first electrodes 103 to be formed. Laterally between the first electrodes 103 to be formed and electrically isolating the portions of the diffusion barrier layer 102, an isolating layer 107, e.g. made of silicon nitride, is provided on the upper surface of the substrate, which is free of the material of the diffusion barrier layer 102. A plurality of first electrodes 103 made of tungsten or nickel are located next to one another and applied onto the diffusion barrier layer 102 optionally including a barrier liner between the diffusion barrier layer 102 and the respective first electrode 103. An ion conducting layer is applied to the planarized surface of the first electrode 103 and the exposed diffusion barrier layer 102 in form of an isolating matrix 104, usually made of germanium-sulfide (GeS) or germanium-selenide (GeSe). The isolating matrix 104 is also referred to as a first functional layer 104. A second functional layer 105, usually made of silver, is applied to the first functional layer 104 and then, a cover layer 106 is applied to the second functional layer 105.

Silver is driven from the second functional layer 105 into the first functional layer 104 by means of photo dissolution, in other words using a radiation of ultraviolet light with a wavelength of approximately 500 nm, for example, or using a corresponding temperature treatment of the programmable arrangement 100. The silver being introduced into the first functional layer clearly forms electrically conductive regions within the electrically isolating matrix of germanium sulfide or germanium selenide. The cover layer 106 protects the functional layers 104 and 105 during the photo dissolution process.

Metal dendrites 202 are formed between an upper electrode 201, which is applied to the functional layers 104, 105 after the removing of the cover layer 106 (see programmable arrangement 200 in FIG. 2), and a respective first electrode 103 by applying a corresponding electrical voltage between the upper electrode 201 and a corresponding first electrode 103 due to a reduction/oxidation process, which occurs between the materials of the first functional layer 104 and the second functional layer 105 and possibly the upper electrode 201. The upper electrode 201 is usually made of a relatively easily oxidizable material, for example silver.

When the dendrite 202 is formed between the upper electrode 201 and a respective first electrode 103 the electrical resistance of an electrical part between the respective first electrode 103 and the upper electrode 201, which will be referred to a second electrode 201 in the following, changes.

In order to position a maximal high number of first electrodes 103 in the programmable arrangement 200, for example in a memory array, it is desirable, to reduce the lateral resolution, in other words the distance between the first electrodes 103, as far as possible.

With the decrease of the distance between the first electrodes 103, the risk of cross talk effect increases, clearly the risk, that, although it is desired to form a dendrite 202 between a first electrode 103 and the second electrode 201, a dendrite is formed between an adjacent other first electrode 103 and the second electrode 201. This may result in the formation of cross talk dendrites 203 at an electrode not to be programmed during the programming of another first electrode 103 due to electrostatic edge effects and the overlapping electrostatic fields that are affected thereby.

As will be described in more detail below, exemplary embodiments of the invention provide an easy mechanism to prevent a possible cross talk between adjacent first electrodes.

In the context of this description chalcogenide material is to be understood for example as any compound containing sulfur, selenium, germanium and/or tellurium. In accordance with one embodiment of the invention the ion conducting material is for example a compound, which is made of a chalcogenide and at least one metal of the group I or group II of the periodic system, for example arsene-trisulfide-silver.

Alternatively, the chalcogenide material contains germanium-sulfide (GeS) or germanium-selenide (GeSe), tungsten oxide ($WO_x$), copper sulphide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

FIG. 3B shows a top view of a programmable arrangement 300, in accordance with this embodiment of the invention a memory cell arrangement. FIG. 3A shows a cross sectional view through the programmable arrangement 300 of FIG. 3B along the intersecting line A-A'.

For clarity reasons, the second dielectric layer 320 which is shown in FIG. 3A and which is applied on the top of the programmable arrangement 300 is not shown in the top view of FIG. 3B.

In accordance with this exemplary embodiment of the invention, the programmable arrangement (which may, as all embodiments of the programmable arrangement, be included in one or more integrated circuits) 300 includes four memory cells 301, 302, 303, 304, which are arranged in rows and columns within a regular matrix array. In general, however, any number of memory cells can be arranged within the memory cell arrangement 300 in a regular or irregular pattern, for example thousands or millions of memory cells, which may in an alternative embodiment of the invention e.g. be arranged in a honey comb cell pattern.

As shown in FIG. 3A, each of the memory cells 301, 302, 303, 304 may be configured such that a first diffusion barrier layer 312 (which may be electrically conductive material) is positioned on the sidewalls and the bottom of first trenches or holes 307 to be formed, which will be described in more detail below. Laterally between the first trenches or holes 307 to be formed and electrically isolating the portions of the diffusion barrier layer 312, an isolating layer 306, e.g. made of silicon nitride (in an alternative embodiment of the invention, e.g. made of silicon oxide, tantalum oxide, aluminum oxide or electrically isolating carbon), is provided on the upper surface of the dielectric substrate 305 made of silicon oxide or silicon nitride or an any other electrically isolating material, which upper surface is free of the material of the diffusion barrier layer 312.

In an embodiment of the invention, first trenches or holes 307 are formed extending into the dielectric 305, wherein, after having deposited the first diffusion barrier layer 312 on the patterned dielectric 305, liner layers are formed at the side walls and the bottom of the first trenches or holes 307 by means of deposition, for example made of titanium (Ti), titanium-nitride (TiN), tantalum (Ta) or tantalum-nitride (TaN). Then, metal may be applied to the liner layers for forming the contact plugs 308 according to a damascene process.

After having formed the contact plugs, a second dielectric 501 (also referred to as an inter layer dielectric), which may be the same or another dielectric that the dielectric 305 of the substrate, may be deposited on the main processing circuit (see FIG. 5A).

Next, second trenches or holes 310 may be formed through the second dielectric 501 such that the contact plugs 308 are at least partially exposed. In a subsequent process, a second diffusion barrier layer 309 may be applied to the resulting structure such that the second diffusion barrier layer 309 covers the side walls and the bottom of the second trenches or holes 310 as well as the exposed surface of the second dielectric 501. Then, in order to form the first electrodes 311, metal may be inserted into the second trenches or holes 310. By way of example, tungsten, as an alternative nickel, may be used as the metal. The metal that extends over the upper surface of the first trenches or holes 310 of the first electrodes 311 to be formed is removed by means of a chemical mechanical polishing (CMP) process.

The first dielectric layer 501 (see cross sectional view 500 in FIG. 5A) is then removed, thereby forming third trenches or holes 511 (see cross sectional view 510 in FIG. 5B).

Thus, as shown in FIG. 5B, the inter metal dielectric 501 may be completely removed so that clearly free standing structures are formed out of the respective metal of the first electrodes 311 and possibly, if provided, a respective liner layer and the second diffusion barrier layer 309. The inter metal dielectric 501 may be removed by means of wet chemical etching or by means dry etching.

As shown in FIG. 5C, ion conducting material, for example chalcogenide (for example GeS or GeSe) 521 is applied to the structure shown in FIG. 5B (see cross sectional view 520 in FIG. 5C).

As ion conducting material any suitable solid state electrolyte, metal ions containing glass, metal ions containing amorphous semiconductor, a chalcogenide glass, which optionally contains metal ions or the like, can be provided. In general, the chalcogenide material contains for example, as described above, a compound, which contains sulfur, selenium and/or tellurium, for example also in ternary, quaternary or higher level compounds.

In an embodiment of the invention, the ion conducting material 521 includes a material being selected from a group of materials consisting of:

CdSe or ZnCdS (in these embodiments, e.g. silver may be used for the metal), $CuO_2$, $TiO_2$, NiO, CoO, $Ta_2O_5$ (in these embodiments, e.g. titanium or nickel may be used for the metal), $WO_2$, $Al:ZnO_x$, $Al_2O_3$ (in these embodiments, e.g. aluminum may be used for the metal), $Cu:MoO_x$, $SrTiO_x$, $Nb_2O_{5-x}$, $Pr_{1-x}Ca_xMnO_3$, $Cr:SrZrO_3$, $Nb:SrTiO_3$ (in these embodiments, e.g. copper may be used for the metal), As an example, the ion conductor 521 is made of a chalcogenide glass, which contains a metal ion compound, wherein the metal is selected from different metals of group I or group II of the periodic system, for example silver copper, zinc or a combination thereof.

The ion conductor layer 521 has, according to this exemplary embodiment of the invention, a layer thickness in the range from about 5 nm to about 300 nm, for example in the range from about 10 nm to about 40 nm, for example about 20 nm.

A second functional layer 522, in accordance with this exemplary embodiment of the invention made of silver, is applied in two dimension to fully cover the ion conducting layer 521, which is also referred to as first functional layer.

In an embodiment of the invention, the second functional layer 522 may include a plurality of electrically conductive layers stacked above one another. In an embodiment of the invention, two, three, four or even more electrically conductive layers stacked above one another may be provided in the second functional layer 522. In an embodiment of the invention, the second functional layer 522 may include a layer stack including Ag/Cu/Ag/Cu.

The second functional layer 522 has a layer thickness of approximately 5 nm to 50 nm, for example a layer thickness of approximately 10 nm to 30 nm, for example a layer thickness of approximately 20 nm. In a subsequent diffusion step, which is not shown in the figures, ultraviolet light having a wavelength of less than approximately 500 nm is radiated onto the arrangement which shown in a cross sectional view, thereby effecting a diffusion of a portion of the silver of the second functional layer 522 into the ion conducting layer 521, clearly an insulating matrix, thereby forming a electrically conductive region within the ion conductor layer 521, which electrically conductive regions are electrically isolated from another by means of the isolating matrix made of the ion conductor materials. As an alternative or in addition, a portion of the silver of the second functional layer 522 can be driven into the ion conductor layer by means of a corresponding annealing step by heating the arrangement.

As shown in FIG. 5D, after having diffused silver material into the ion conductor layer 521 for forming an upper electrode, also referred to as second electrode in the following, material for the second electrode is brought into a fourth trench 523 (FIG. 5C), which is formed between the first electrodes 311, on the second functional layer 522, such that the respective fourth trenches 523 are filled and possibly overfilled the material for the second electrode.

The aspect ratio of the third trenches 523 is 1:10 in accordance with an exemplary embodiment of the invention, for example 1:5, according to an embodiment of the invention 1:2.

In accordance with an embodiment of the invention, it is optionally provided in advance to deposit fully and in two dimensions an additional liner layer on the second functional layer 522, wherein titanium (Ti), titanium-nitride (TiN), tantalum (Ta) or tantalum-nitride (TaN) can be provided as a liner layer, wherein the liner layer possibly also serves as diffusion barrier, for example in case that copper or silver is used as material 531 for the second electrode (see cross sectional view 530 in FIG. 5D).

Figure 5E:
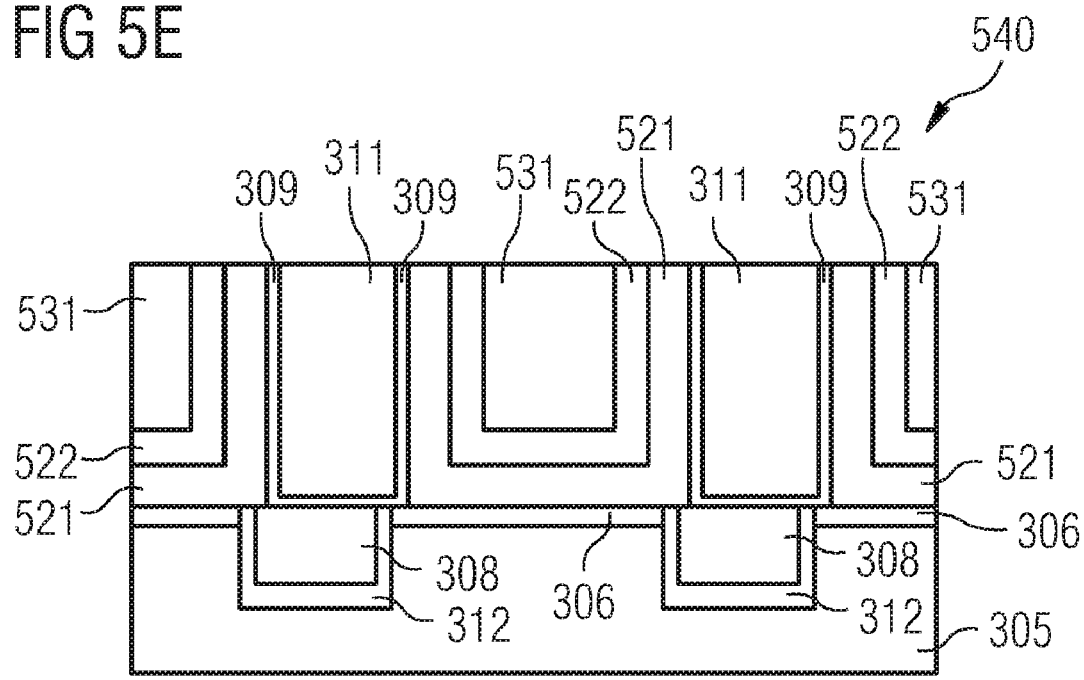
FIG. 5E shows a cross sectional view of a programmable arrangement at a fifth time instant of its manufacture.
Figure 5F:
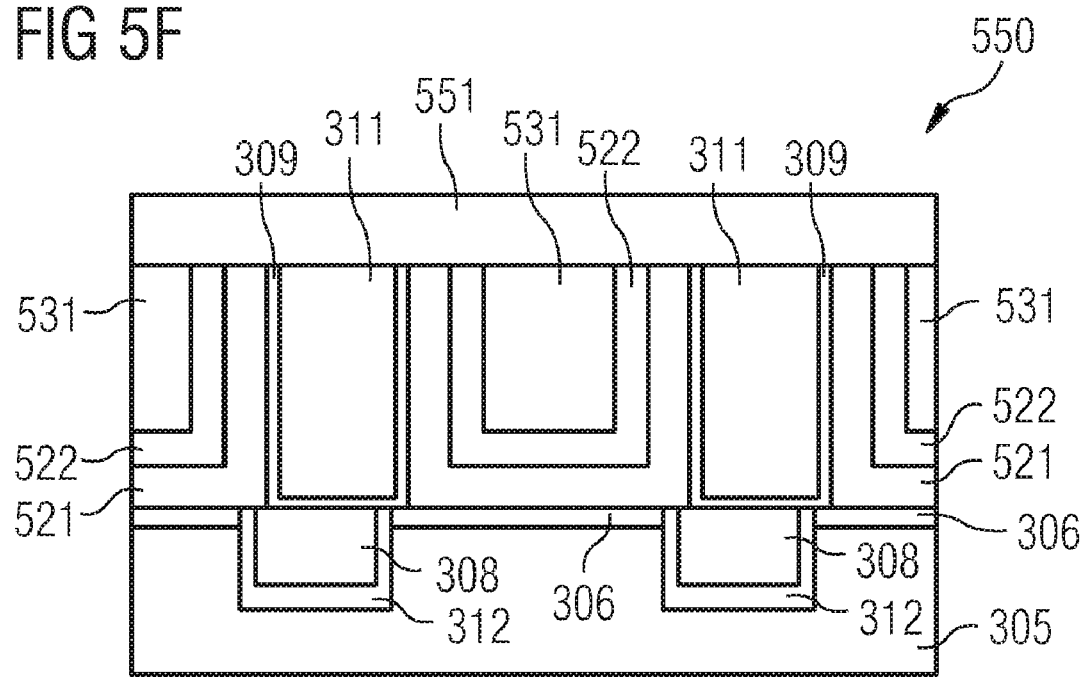
FIG. 5F shows a cross sectional view of a programmable arrangement at a sixth time instant of its manufacture.

Now, the memory cell arrangement 300 is completed, however, the additional process steps shown in FIG. 5E and FIG. 5F can be provided in an alternative embodiment of the invention.

In an exemplary embodiment of the invention, it can be provided that a part of the material of the second electrode that overfills the fourth trenches 523 and also a part of the ion conductor layer 521 is removed by means of a chemical mechanical polishing process such that the upper surface of the first electrodes 311 is exposed (see cross sectional view 540 in FIG. 5E).

Next, a third dielectric layer 551 may be deposited in two dimensions on the planarized surface of the layer arrangement in accordance with FIG. 5E (see cross sectional view 550 in FIG. 5F).

Thus, as shown in FIG. 4, parts of the ion conductor layer 521 are applied to the side walls of the first electrodes and the liner layers of the first electrodes, respectively, wherein the side walls of the first electrodes are substantially vertically, in general in an angle non-equal 0° (for example in angle α, for which holds true 0°<α<102°), arranged with regard to the main processing surface of the substrate 305, which main processing surface runs parallel to the upper surface of the first electrodes 311. The second electrode 531 has regions which are included between the side surfaces of the first electrodes, wherein, in an alternative embodiment of the invention, it can be provided, that the second electrode also has a conductive connection through the third dielectric layer 551 for their controlling.

In one embodiment of the invention, the controlling can be provided in a periphery area of the memory cell arrangement 300, which is not shown here for reasons of clarity.

By applying an electrical voltage between the second electrode 531 and a respective first electrode 311, a constrained and limited electrical field is generated in a location, in FIG. 4 e.g. highlighted as ellipses 401.

The generated electrical field causes the horizontal formation, in other words the horizontal growth of a metal conductive dendrite 402 between the second electrode 531 and the respective first electrode 311 in case that the electrical voltage that generates the electrical field is greater than a threshold voltage of a respective memory cell, thereby changing the electrical properties of the respective memory cell, for example the conductivity of an electrical portion between the first electrode 311 and the second electrode 531. This enables the storage of information into a respective memory cell, for example as a binary information, as a ternary information or as a quaternary information or as an information with an even greater number of bits, depending on the capability of the detection circuit and its granularity of the detection of the respective property of the memory cell by means of forming the dendrites between the second electrode 531 and the respective first electrode 311. The dendrites 402, also referred to as horizontal filaments, cause a substantial reduction of the electrical resistance of the ion conductor layer 521 between the second electrode 531 and a respective first electrode 311. The change of the electrical resistance is measured and thus, the information stored in the memory cell is read.

Clearly the second electrode works as a Faraday's cage with regard to the adjacent memory cells, in other words with regard to another first electrode which is adjacent to a first electrode to be driven. Thus, the active region on which the formation of the filaments has an impact, is substantially greater as for vertical filaments. This has the effect in the context of the control of the "on" resistance (which represents a first binary information, i.e. a first logical value "0") and the "off" resistance (which represents a second binary information, i.e. a second logical value "1") and the variation between the threshold voltage between different memory cells in a memory cell array. For a first electrode having a diameter of 65 nm, for example, an active region of approximately 3,500 $nm^2$ results with common vertical filaments whereas with a diameter of 65 nm of the first electrodes and a height of the first electrodes of 130 nm, this results in an active region of approximately 25,000 $nm^2$, thereby increasing the active region by a factor of 8.

Thus, clearly in accordance with an exemplary embodiment of the invention it is provided, to remove the material between respective two adjacent electrodes which serve as a bottom electrode of a respective memory cell, to at least partially pattern them and to apply the ion conductor layer and the doping metal material of the second functional layer to the ion conductor layer in this structure and thereby enabling a growth of dendrites in a direction that is substantially parallel to a plane that is parallel to the main processing surface of the memory cell arrangement.

In this way, the cross talk between two adjacent memory cells during programming may be reduced substantially, thereby increasing the reliability of a memory cell and furthermore, reducing undesired creeping effects through electrically conductive parts formed by the dendrites. Furthermore, the variation of the resistances and the threshold voltages between the individual memory cells in the entire memory cell array may substantially be reduced.

Figure 6:
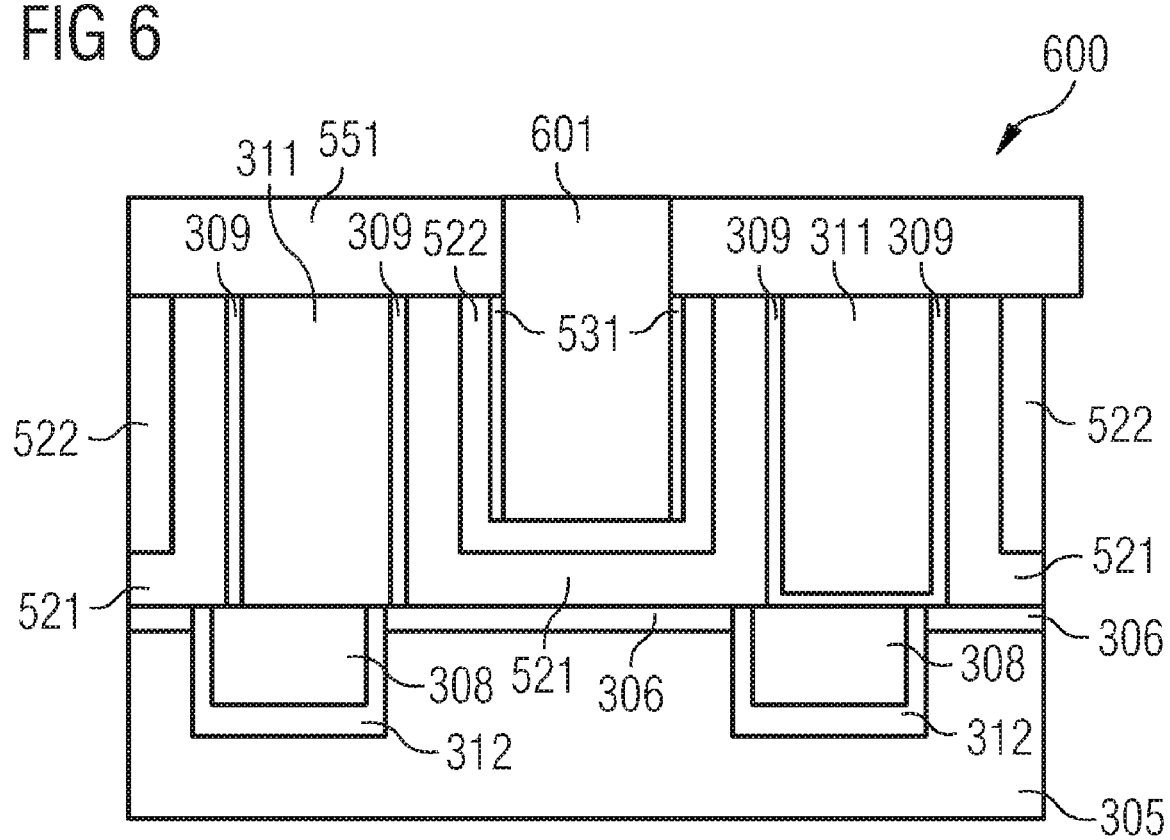
FIG. 6 shows a cross sectional view of a programmable arrangement in accordance with an alternative embodiment of the invention.

FIG. 6 shows a cross sectional view 600 of a programmable arrangement in accordance with an alternative embodiment of the invention.

The programmable arrangement of FIG. 6 is similar to the programmable arrangement 550 shown in FIG. 5F with the difference that the material 531 for the second electrode is partially replaced by another electrically conductive material or by an electrically insulating material. This replacement may be carried out using an anisotropic etching (e.g. RIE) process, followed by a damascene process to deposit the replacement material 601. In an embodiment of the invention, an underfill of the material 531 for the second electrode may be provided, followed by a filling and overfilling the isolating material which may then be planarized (e.g. by means of a CMP process).

Figure 7A:
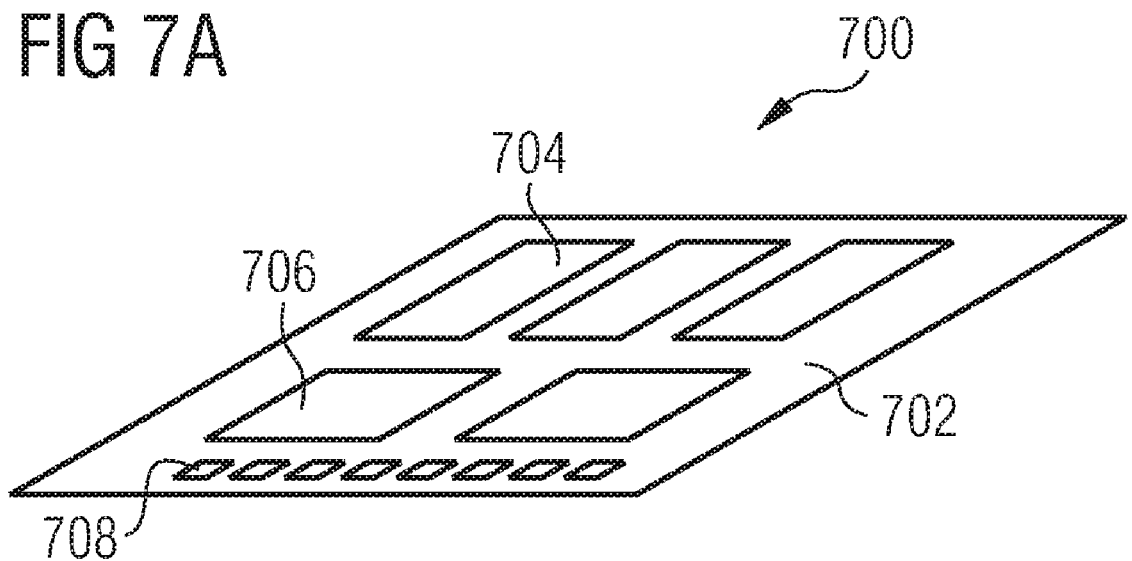
FIGS. 7A and 7B show a memory module (FIG. 7A) and a stackable memory module (FIG. 7B) in accordance with an embodiment of the invention.
Figure 7B:
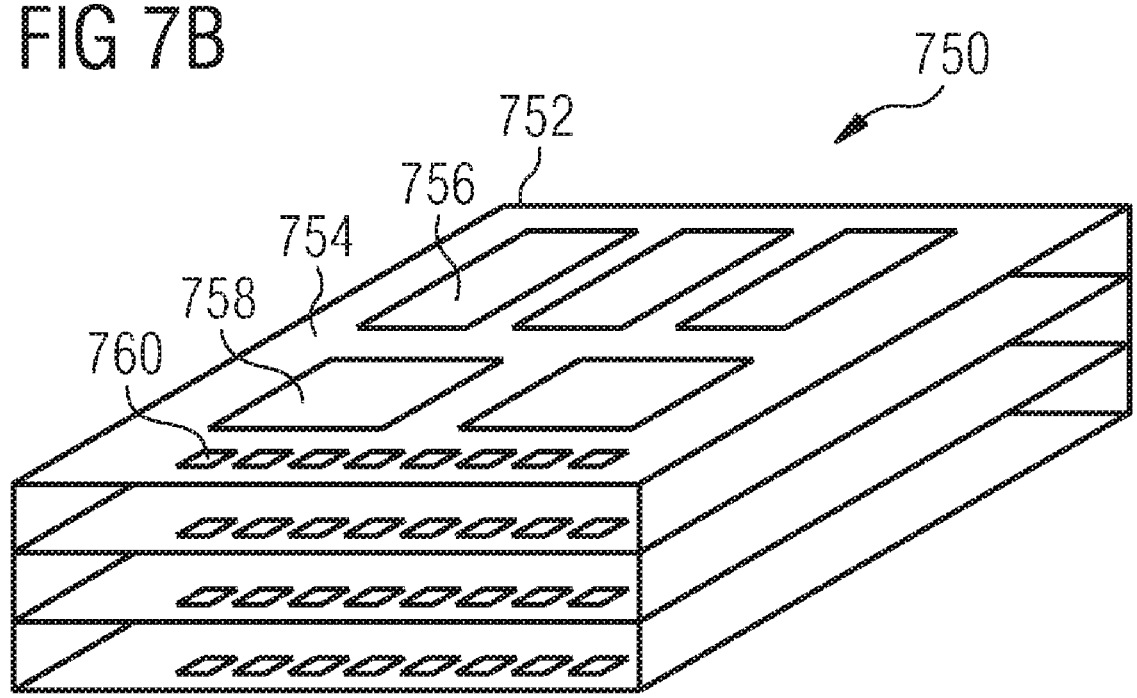

As shown in FIGS. 7A and 7B, in some embodiments, memory devices such as those described herein may be used in modules.

In FIG. 7A, a memory module 700 is shown, on which one or more memory devices 704 are arranged on a substrate 702. The memory device 704 may include numerous memory cells, each of which uses a memory element in accordance with an embodiment of the invention. The memory module 700 may also include one or more electronic devices 706, which may include memory, processing circuitry, control circuitry, addressing circuitry, bus interconnection circuitry, or other circuitry or electronic devices that may be combined on a module with a memory device, such as the memory device 704. Additionally, the memory module 700 includes multiple electrical connections 708, which may be used to connect the memory module 700 to other electronic components, including other modules.

As shown in FIG. 7B, in some embodiments, these modules may be stackable, to form a stack 750. For example, a stackable memory module 752 may contain one or more memory devices 756, arranged on a stackable substrate 754. The memory device 756 contains memory cells that employ memory elements in accordance with an embodiment of the invention. The stackable memory module 752 may also include one or more electronic devices 758, which may include memory, processing circuitry, control circuitry, addressing circuitry, bus interconnection circuitry, or other circuitry or electronic devices that may be combined on a module with a memory device, such as the memory device 756. Electrical connections 760 are used to connect the stackable memory module 752 with other modules in the stack 750, or with other electronic devices. Other modules in the stack 750 may include additional stackable memory modules, similar to the stackable memory module 752 described above, or other types of stackable modules, such as stackable processing modules, control modules, communication modules, or other modules containing electronic components.

In an embodiment of the invention, an integrated circuit having a programmable arrangement is provided. The programmable arrangement may include a substrate having a main processing surface, at least two first electrodes, wherein each of the two first electrodes has a side surface being arranged at a respective angle with regard to the main processing surface, the side surfaces facing one another, at least one second electrode, and ion conducting material between each of the at least two first electrodes and the at least one second electrode, wherein the at least one second electrode is arranged partially between the side surfaces of the two first electrodes facing one another.

The ion conductor material may be arranged on the side surfaces of the at least two first electrodes at least partially as ion conductor layer.

The ion conductor layer may be arranged between the at least two first electrodes.

In an embodiment of the invention, the ion conductor material is made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

By way of example, the ion conductor material is made of chalcogenide material containing metal ions.

The chalcogenide material may be selected from a group consisting of sulfur, selenium, germanium and tellurium or a combination of these materials.

The metal ions may be made of a metal, selected from a group consisting of sulfur, copper and zinc or a combination of these materials.

The at least two first electrodes or the at least one second electrode may be made of a material containing silver.

In an embodiment of the invention, the integrated circuit may further include a metallic dendrite extending from the at least one second electrode into the ion conductor material in direction of one of the at least two first electrodes.

In an embodiment of the invention, the integrated circuit may further include a metallic dendrite extending from one first electrode into the ion conductor material in direction of the at least one second electrode.

In an embodiment of the invention, the integrated circuit may further include a trench between the at least two first electrodes, wherein the ion conductor material is arranged at least partially at the side surfaces of the at least two first electrodes in the trench, and wherein the at least one second electrode is arranged at least partially in the trench.

In an embodiment of the invention, the integrated circuit may further include a dielectric layer on or above the at least two first electrodes and the at least one second electrode.

In an embodiment of the invention, an integrated circuit having a programmable arrangement is provided. The programmable arrangement may include a substrate having a main processing surface, at least two anodes, wherein each of the at least two anodes has a side surface being arranged at a respective angle with regard to the main processing surface, the side surfaces facing one another, at least one cathode, and ion conductor material between each of the at least two anodes and the at least one cathode, wherein the at least one cathode is arranged at least partially between the side surfaces facing one another.

In an embodiment of the invention, the ion conductor material is arranged on the side surfaces of the at least two anodes at least partially as ion conductor layer.

The ion conductor layer may be arranged between the at least two anodes.

The ion conductor material may be made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

In an embodiment of the invention, the ion conductor material is made of chalcogenide material containing metal ions.

The chalcogenide material may be selected from a group consisting of sulfur, selenium, germanium and tellurium or a combination of these materials.

In an embodiment of the invention, the metal ions are made of a metal, selected from a group consisting of sulfur, copper and zinc or a combination of these materials.

In an embodiment of the invention, the at least two anodes or the at least one cathode are made of a material containing silver.

In an embodiment of the invention, the integrated circuit may further include a metallic dendrite extending from the at least one cathode into the ion conductor material in direction of one of the at least two anodes.

In an embodiment of the invention, the integrated circuit may further include a metallic dendrite extending from one anode into the ion conductor material in direction of the at least one cathode.

In an embodiment of the invention, the integrated circuit may further include a trench between the at least two anodes, wherein the ion conductor material is arranged at least partially at the side surfaces of the at least two anodes in the trench, and wherein the at least one cathode is arranged at least partially in the trench.

In an embodiment of the invention, the integrated circuit may further include a dielectric layer on or above the at least two anodes and the at least one cathode.

In an embodiment of the invention, an integrated circuit having a programmable arrangement is provided. The programmable arrangement may include at least two first electrodes, a trench between the at least two first electrodes, ion conductor material on at least a part of the trench side surfaces of the at least two first electrodes, and at least one second electrode in the trench on at least a part of the ion conductor material between the at least two first electrodes.

The ion conductor material may be arranged on the side surfaces of the at least two first electrodes at least partially as ion conductor layer.

The ion conductor material may be made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

The ion conductor material may be made of chalcogenide material containing metal ions.

The chalcogenide material may be selected from a group consisting of sulfur, selenium, germanium and tellurium or a combination of these materials.

The metal ions may be made of a metal, selected from a group consisting of sulfur, copper and zinc or a combination of these materials.

The at least two first electrodes or the at least one second electrode may be made of a material containing silver.

In an embodiment of the invention, the integrated circuit may further include a metallic dendrite extending from the at least one second electrode into the ion conductor material in direction of one of the at least two first electrodes.

In an embodiment of the invention, the integrated circuit may further include a metallic dendrite extending from one first electrode into the ion conductor material in direction of the at least one second electrode.

In an embodiment of the invention, the integrated circuit may further include a dielectric layer on or above the at least two first electrodes and the at least one second electrode.

In an embodiment of the invention, a method for manufacturing an integrated circuit having a programmable arrangement is provided. The method may include applying at least two first electrodes on a main processing surface of a substrate such that each of the at least two first electrodes has a side surface being arranged at a respective angle with regard to the main processing surface, the side surfaces facing one another, applying ion conductor material on at least a part of the side surfaces of the at least two first electrodes, and applying at least a second electrode to at least a part of the ion conductor material between the side surfaces of the at least two first electrodes.

The ion conductor material may be made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

Furthermore, the ion conductor material may be made of chalcogenide material, containing metal ions.

The chalcogenide material may be selected from a group consisting of sulfur, selenium, germanium and tellurium or a combination of these materials.

The metal ions may be made of a metal, being selected from a group consisting of sulfur, copper and zinc or a combination of these materials.

In an embodiment of the invention, a method for manufacturing an integrated circuit having a programmable arrangement is provided. The method may include applying at least two anodes on a main processing surface of a substrate such that each of the at least two anodes has a side surface being arranged at a respective angle with regard to the main processing surface, the side surfaces facing one another, applying ion conductor material on at least the side surfaces of the at least two anodes, and applying at least one cathode on at least a part of the ion conductor material between the side surfaces of the at least two first electrodes.

The ion conductor material may be made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

The ion conductor material may be made of chalcogenide material, containing metal ions.

In an embodiment of the invention, the chalcogenide material is selected from a group consisting of sulfur, selenium, germanium and tellurium or a combination of these materials.

The metal ions may be made of a metal, being selected from a group consisting of sulfur, copper and zinc or a combination of these materials.

In an embodiment of the invention, a method for manufacturing an integrated circuit having a programmable arrangement is provided. The method may include forming a trench between at least two first electrodes, applying ion conductor material on at least a part of the trench side surfaces of the at least two first electrodes, and applying at least one second electrode in the trench on at least a part of the ion conductor material between the at least two first electrodes.

The ion conductor material may be made of chalcogenide material or of a material being selected from a group of materials consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, $Nb:SrTiO_3$.

The ion conductor material may be made of chalcogenide material, containing metal ions.

The chalcogenide material may be selected from a group consisting of sulfur, selenium, germanium and tellurium or a combination of these materials.

The metal ions may be made of a metal, being selected from a group consisting of sulfur, copper and zinc or a combination of these materials.

In an embodiment of the invention, a memory module is provided. The memory module may include a plurality of integrated circuits, wherein at least one integrated circuit of the plurality of integrated circuits may include a programmable arrangement. The programmable arrangement may include a substrate having a main processing surface, at least two first electrodes, wherein each of the two first electrodes has a side surface being arranged at a respective angle with regard to the main processing surface, the side surfaces facing one another, at least one second electrode, and ion conducting material between each of the at least two first electrodes and the at least one second electrode, wherein the at least one second electrode is arranged partially between the side surfaces of the two first electrodes facing one another.

In an embodiment of the invention, the memory module is a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit that includes at least two memory cells, the integrated circuit comprising:
    a substrate having a main processing surface;
    two first electrodes, wherein each of the two first electrodes has a side surface being arranged at a respective angle with regard to the main processing surface, the side surfaces facing one another, the two first electrodes comprising first electrodes of two neighboring memory cells;
    a second electrode, the second electrode being arranged partially between the side surfaces of the two first electrodes facing one another, the second electrode comprising a common second electrode for both of the two neighboring memory cells;
    ion conducting material between each of the two first electrodes and the second electrode, and
    a metallic layer disposed over the ion conducting material and the second electrode, wherein a first portion of the metallic layer is disposed over the main processing surface and remaining portions of the metallic layer are disposed parallel to the side surfaces of the two first electrodes facing one another.

2. The integrated circuit of claim 1, wherein the ion conducting material is arranged on the side surfaces of the two first electrodes at least partially as an ion conductor layer.

3. The integrated circuit of claim 2, wherein the ion conductor layer is arranged between the two first electrodes.

4. The integrated circuit of claim 3, wherein the ion conducting material comprises a chalcogenide material or a material selected from the group consisting of CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, and $Nb:SrTiO_3$.

5. The integrated circuit of claim 4, wherein the ion conducting material comprises chalcogenide material containing metal ions.

6. The integrated circuit of claim 4, wherein the ion conducting material comprises a chalcogenide material, the chalcogenide material being selected from the group consisting of sulfur, selenium, germanium and tellurium and combinations of these materials.

7. The integrated circuit of claim 5, wherein the metal ions comprise a metal, selected from the group consisting of sulfur, copper and zinc and combinations of these materials.

8. The integrated circuit of claim 1, wherein the metallic layer comprises silver.

9. The integrated circuit of claim 1, further comprising a metallic dendrite extending from the second electrode into the ion conducting material in a direction of one of the two first electrodes.

10. The integrated circuit of claim 1, further comprising a metallic dendrite extending from one first electrode into the ion conducting material in a direction of the second electrode.

11. The integrated circuit of claim 1, further comprising a trench between the two first electrodes, wherein the ion conducting material is arranged at least partially at the side surfaces of the two first electrodes in the trench and wherein the second electrode is arranged at least partially in the trench.

12. The integrated circuit of claim 1, further comprising a dielectric layer on or above the two first electrodes and the second electrode.

13. The integrated circuit of claim 11, wherein the ion conducting material is arranged on the side surfaces of the two first electrodes at least partially as an ion conductor layer.

14. The integrated circuit of claim 11, wherein the ion conducting material comprises chalcogenide material or of a material selected from the group consisting of: CdSe, ZnCdS, $CuO_2$, $TiO_2$, NiO, CoO, $Ta_2O_5$, $WO_2$, $Al:ZnO_x$, $Al_2O_3$, $Cu:MoO_x$, $SrTiO_x$, $Nb_2O_{5-x}$, $Pr_{1-x}Ca_xMnO_3$, $Cr:SrZrO_3$, and $Nb:SrTiO_3$.

15. The integrated circuit of claim 14, wherein the ion conducting material comprises chalcogenide material containing metal ions.

16. The integrated circuit of claim 14, wherein the ion conducting material comprises chalcogenide material, the chalcogenide material being selected from the group consisting of sulfur, selenium, germanium and tellurium and combinations of these materials.

17. The integrated circuit of claim 15, wherein the metal ions comprise a metal, selected from the group consisting of sulfur, copper and zinc and combinations of these materials.

18. The integrated circuit of claim 16, wherein the metallic layer comprises silver.

19. The integrated circuit of claim 11, further comprising a metallic dendrite extending from the second electrode into the ion conducting material in a direction of one of the two first electrodes.

20. The integrated circuit of claim 11, further comprising a metallic dendrite extending from one first electrode into the ion conducting material in a direction of the second electrode.

21. The integrated circuit of claim 11, further comprising a dielectric layer on or above the two first electrodes and the second electrode.

22. A method for manufacturing an integrated circuit having a programmable arrangement, the method comprising:
    forming at least two first electrodes over a main processing surface of a substrate such that each of the at least two first electrodes has a side surface arranged at a respective angle with regard to the main processing surface, the side surfaces facing one another, the at least two first electrodes comprising first electrodes of neighboring memory cells;
    forming ion conductor material on at least a part of the side surfaces of the at least two first electrodes;
    forming a metallic layer over the ion conductor material; and
    forming at least a second electrode adjacent to at least a part of the metallic layer and the ion conductor material between the side surfaces of the at least two first electrodes, the at least a second electrode comprising a common second electrode of the neighboring memory cells.

23. The method of claim 22, further comprising:
    forming a trench between the at least two first electrodes;
    wherein forming the ion conductor material comprises forming ion conductor material on at least a part of the trench side surfaces of the at least two first electrodes; and wherein forming at least a second electrode comprises forming at least one second electrode in the trench on at least a part of the ion conductor material between the at least two first electrodes.

24. A memory module, comprising:

a plurality of integrated circuits, wherein at least one integrated circuit of the plurality of integrated circuits comprises a programmable arrangement, the programmable arrangement comprising:

a substrate having a main processing surface;

at least two first electrodes, wherein each of the at least two first electrodes has a side surface being arranged at a respective angle with regard to the main processing surface, the side surfaces facing one another, the at least two first electrodes comprising first electrodes of at least two neighboring memory cells;

at least one second electrode, the at least one second electrode being arranged partially between the side surfaces of the at least two first electrodes facing one another, the at least one second electrode comprising a common second electrode of the at least two neighboring memory cells;

ion conducting material between each of the at least two first electrodes and the at least one second electrode; and a metallic layer disposed over the ion conducting material and the second electrode, a first portion of the metallic layer disposed over the main processing surface and remaining portions of the metallic layer disposed parallel to the side surfaces of the at least two first electrodes facing one another, wherein the at least one second electrode comprises a first material layer contacting the remaining portions of the metallic layer, and a replacement material contacting the first portion of the metallic layer.

\* \* \* \* \*